United States Patent [19]
Sobolewski et al.

[11] Patent Number: 6,069,484
[45] Date of Patent: May 30, 2000

[54] SOURCE MEASURE UNIT CURRENT PREAMPLIFIER

[75] Inventors: Gregory Sobolewski, Seven Hills; Lawrence M. Klubert, Lakewood, both of Ohio

[73] Assignee: Keithley Instruments, Inc., Cleveland, Ohio

[21] Appl. No.: 08/937,477

[22] Filed: Sep. 25, 1997

[51] Int. Cl.[7] .................................................. G01R 31/00
[52] U.S. Cl. ................................................ 324/765; 324/754
[58] Field of Search .................................. 324/765, 754, 324/427; 327/427, 373, 380

[56] References Cited

U.S. PATENT DOCUMENTS

| | | | |
|---|---|---|---|
| 4,714,890 | 12/1987 | Deschene et al. | 324/71.1 X |
| 5,039,934 | 8/1991 | Banaska | 323/268 |
| 5,070,297 | 12/1991 | Kwon et al. | 324/754 |
| 5,144,154 | 9/1992 | Banaska | 324/115 X |
| 5,644,115 | 7/1997 | Knauer | 200/175 |

*Primary Examiner*—Josie Ballato
*Assistant Examiner*—T. R. Sundaram
*Attorney, Agent, or Firm*—Pearne, Gordon, McCoy & Granger LLP

[57] ABSTRACT

A bi-directional current scaling preamplifier is inserted between a device under test and a source measure unit or a source measure unit and switching matrix combination. The bi-directional current scaling preamplifier is formed from an operational amplifier, a range-changing network, and a voltage to current converting circuit. Either the network or the converting circuit is provided with an inverter. The elements are arranged so that current from the source measure unit into the device under test is bi-directionally scaled.

13 Claims, 3 Drawing Sheets

SOURCE MEASURE UNIT CURRENT PREAMPLIFIER

BACKGROUND OF THE INVENTION

The present invention relates to measurements involving very small currents and, in particular, to a preamplifier for use with a source measure unit.

Source measure units are used to make precision measurements in many fields, including the testing of semiconductor products. For example, U.S. Pat. No. 5,039,934 describes one such device and range-changing in such a device is described in U.S. Pat. No. 5,144,154, both of which are incorporated herein by reference. Source measure units force either a voltage or a current and then respectively measure a resulting current or voltage.

It is not uncommon for these devices to measure currents of a few picoamperes. The measurement of such low currents is adversely affected by undesired capacitances and other effects such as dielectric absorption of charge carriers. These effects are exacerbated by multiple source measure units, long test cables and relay switching matrixes used in making such measurements in a production environment, such as found in a semiconductor fabrication facility, where many measurements must be made as quickly as possible.

Switching matrixes allow source measure units to be selectively connected to various test points on a device under test. One such switching matrix is described in U.S. Pat. No. 5,644,115 and is incorporated herein by reference.

SUMMARY OF THE INVENTION

A measurement system for performing measurements on a device under test includes a source measure unit and a preamplifier. The preamplifier is connectable between the source measure unit and the device under test in a position closer to said device under test than to said source measure unit. The preamplifier bi-directionally scales source measure unit current with respect to device under test current.

DESCRIPTION OF THE PREFERRED EMBODIMENTS

Figure 1:
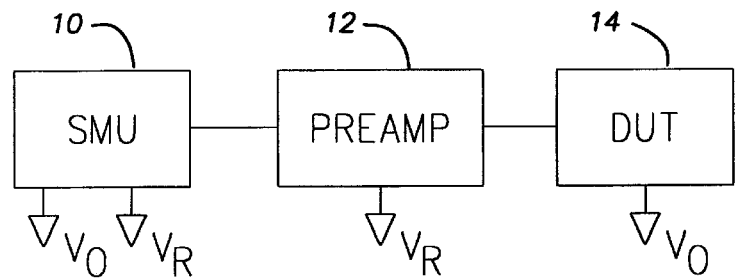
FIG. 1 is a block diagram of a measurement system according to the invention.

Referring to FIG. 1, a source measure unit (SMU) 10 is connected to a preamplifier 12 which is in turn connected to a device under test (DUT) 14. The SMU 10 and the preamplifier 12 are connected to a reference voltage $V_R$. The SMU 10 and the DUT 14 are also connected to a reference voltage $V_0$. $V_R$ and $V_0$ can be the same reference but this need not be the case. The preamplifier 12 scales the current passing through it while maintaining the voltage (i.e., the current from the SMU is directly proportional to the current into the DUT). This is the case whether the SMU 10 is sourcing current or sourcing voltage (and respectively measuring current or measuring voltage). The reference $V_R$ provides a path for the difference between the current out of the SMU 10 and the current into the DUT 14.

The preamplifier 12 can be made small enough to be located close to the DUT 14, even when there are many of them (e.g., 10–20). By having the preamplifier 12 scale up the current from the DUT 14, the detrimental effects of long cables and/or switching matrixes between the DUT and the SMU can be minimized. If, for example, the current is scaled up to 100 microamperes, the effects of stray capacitance and dielectric absorption of charge carriers from the cables and matrixes can be neglected. At the same time, the preamplifier 12 can be working with DUT currents in, for example, the range of picoamperes.

Figure 2:
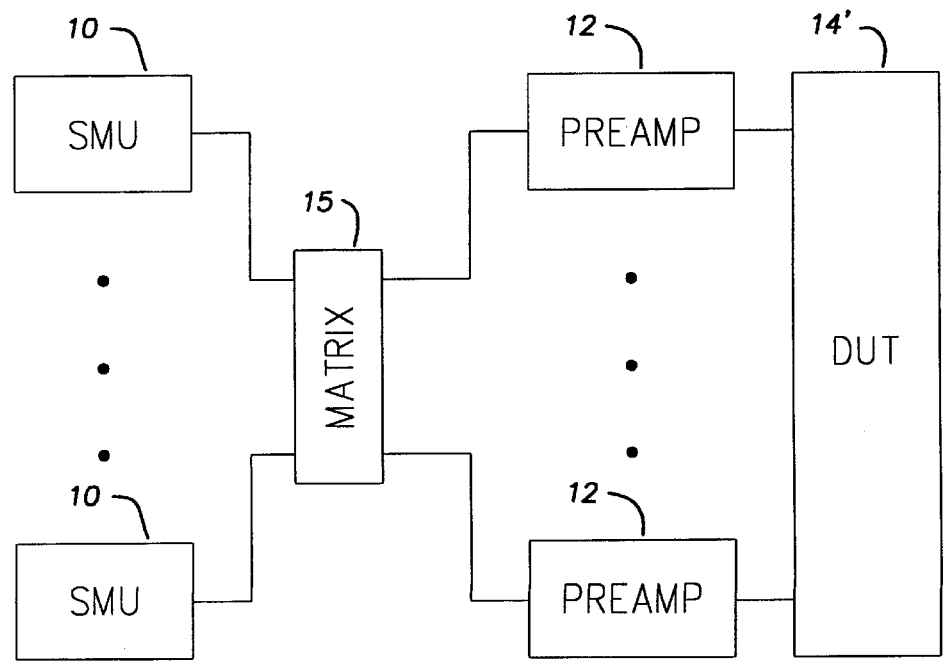
FIG. 2 is a block diagram of another embodiment of a measurement system according to the invention.

Referring to FIG. 2, an additional embodiment of the invention is illustrated. Multiple SMUs 10 are connected to a switching matrix 15 (there also may be multiple switching matrices, as well as multiple devices under test) which selectively makes connections between SMUs 10 and multiple preamplifiers 12 connected to a DUT 14'.

In the preferred embodiments, the preamplifier 12 is located as close as possible to the DUTs to improve the speed, accuracy, and repeatability of measurements. This typically results in the preamplifier 12 being located closer to the DUT than to the SMU or switching matrix.

Figure 3:
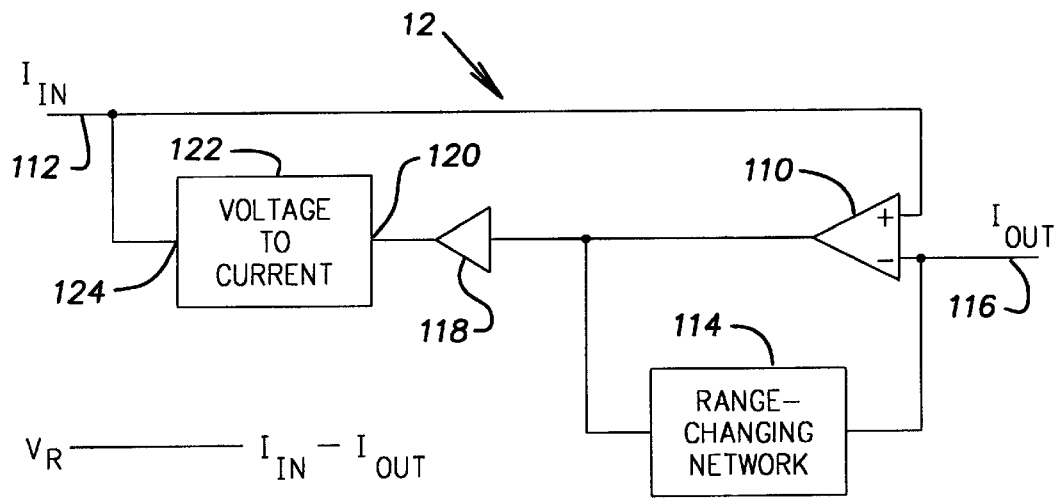
FIG. 3 is a block diagram of a preamplifier according to the invention.

Referring to FIG. 3, a preamplifier 12 includes an operational amplifier 110. The non-inverting input of the amplifier 110 is connected to the input 112 of the preamplifier 12. One side of a range-changing network 114 is connected to the inverting input of the amplifier 110 and is connected to the output 116 of the preamplifier 12.

The other side of the range-changing network 114 is connected to the output of the amplifier 110 and to the input of an inverter 118. The output of the inverter 118 is connected to a voltage terminal 120 of a voltage to current converting circuit 122. The current terminal 124 of the circuit 122 is connected to the preamplifier input terminal 112.

The reference terminal $V_R$ provides a path for the difference between the current entering the input terminal 112, $I_{IN}$, and the current exiting the output terminal 116, $I_{OUT}$. In the preferred embodiment, $V_R$ communicates with $I_{IN}$ AND $I_{OUT}$ via the power supplies of the inverter 118 and/or the voltage to current circuit 122. An example of this communication is set fourth below.

It is also possible to use a current inverter after the voltage to current circuit instead of a voltage inverter before the voltage to current converting circuit.

Figure 4:
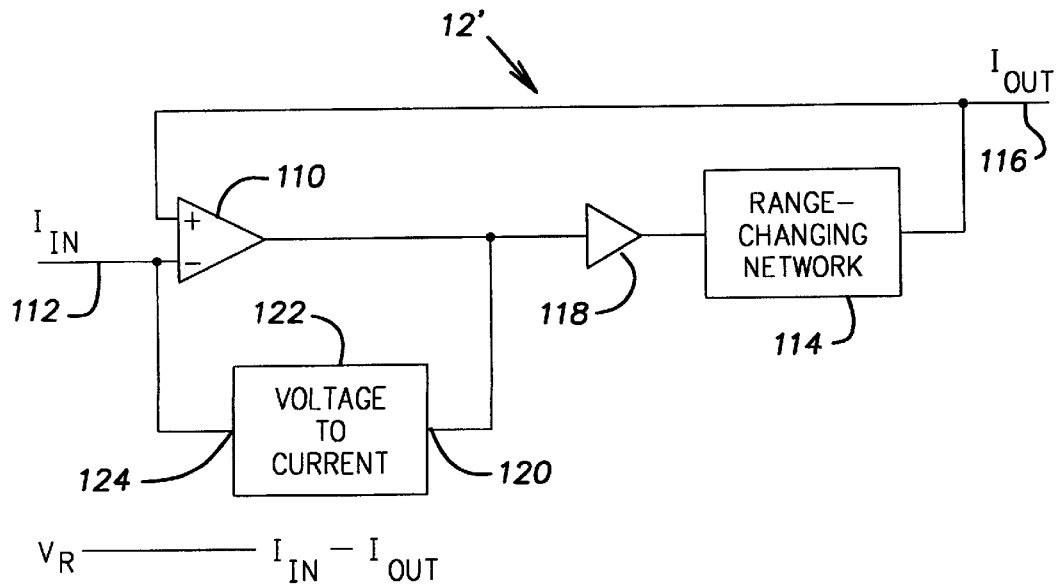
FIG. 4 is a block diagram of another embodiment of a preamplifier according to the invention.

In operation, voltage on the input terminal 112 forces an equal voltage on the output terminal 116 because of the negative feedback loop through the voltage to current circuit 122 back to the amplifier 110. This establishes a voltage at the output of the amplifier 110 according to the range-changing network 114. This voltage is transformed to a current by the inverting voltage to current converting circuit formed of the inverter 118 and the circuit 122. The value of this transformed current is forced to $I_{IN}$ by what is effectively a negative feedback loop (because of the inverter 118) back to the amplifier 110. The value of $I_{OUT}$ is determined by the ratio of the effective resistances of the range changing network 114 and the voltage to current converter circuit 122 (which may be, for example, a resistor). Referring to FIG. 4, another preamplifier 12' similar to the preamplifier 12 includes the same components arranged in a symmetrically related manner. The location of the input 112 and the output 116 are interchanged and the location of the range-changing network 114 and the voltage to current converting circuit 122 are interchanged. The interchanging of the voltage to current converting circuit and the range-changing network results in an inverting range changing network. The operation of the preamplifier 12' is analogous to that of the preamplifier 12.

Figure 5:
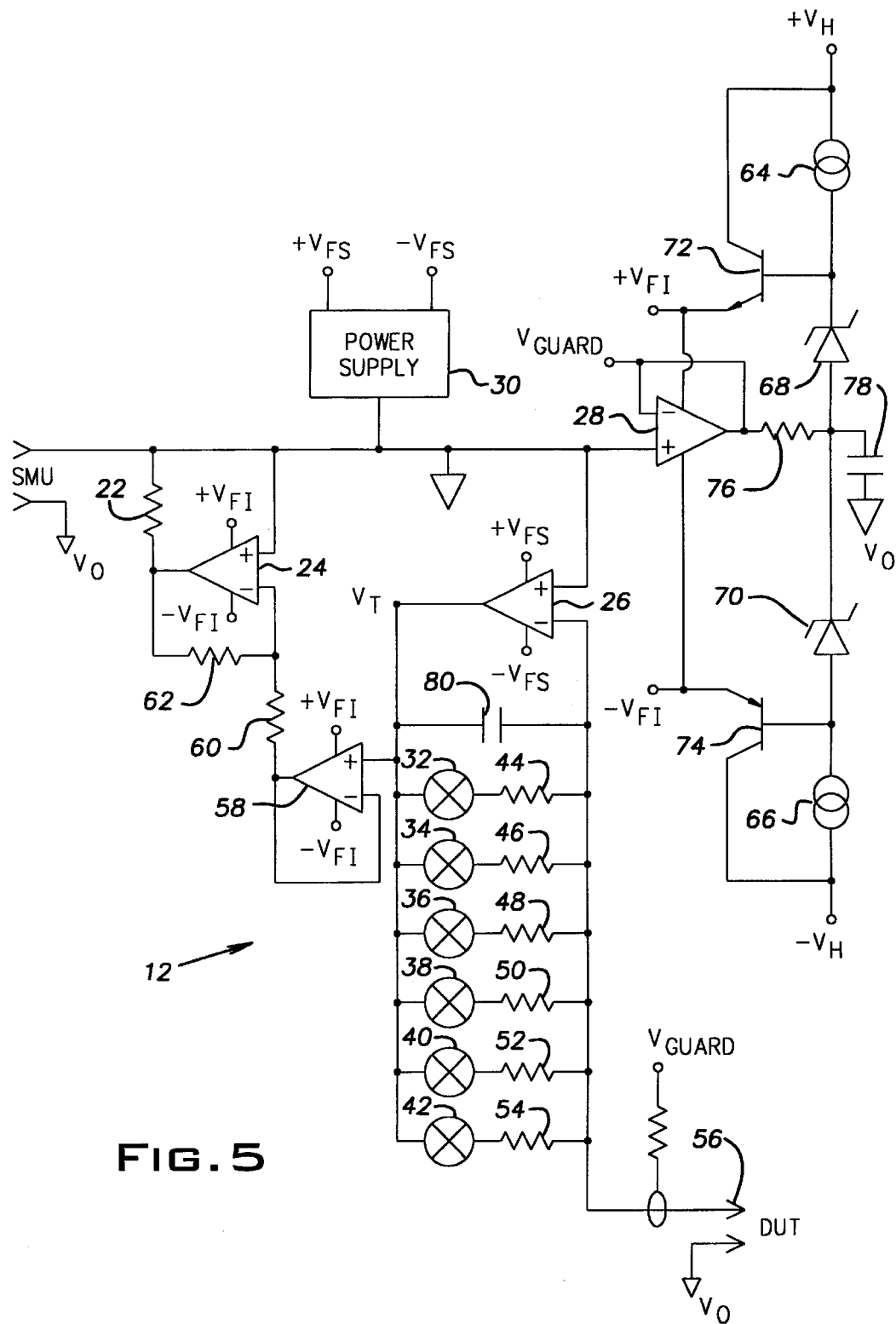
FIG. 5 is a schematic diagram of a preamplifier according to the invention.

Referring to FIG. 5, a particular embodiment of the preamplifier 12 is connectable between a SMU and a DUT. The forced terminal of the SMU is connectable to the input terminal 16 and hence the load resistor 22 (e.g., 20 KΩ), the non-inverting input of the operational amplifier 24, the non-inverting input of the operational amplifier 26, and the non-inverting input of the operational amplifier 28. The amplifier 26 supplies very small currents (e.g., as small as a picoampere) and thus should have a very small bias current, such as a CMOS operational amplifier with a leakage current of less than 2 femtoamperes.

The power supply 30 provides plus and minus voltages $V_{FS}$ (e.g., ±5 volts) with respect to the terminal 16 voltage $V_F$ (because the power supply 30 "sits" on the output of the SMU, it should have extremely low common-mode current and low noise). The power supply 30 supplies power to the amplifier 26.

The switches 32, 34, 36, 38, 40, 42 in respective series with the resistors 44, 46, 48, 50, 52, 54 (e.g., 20 GΩ, 2 GΩ, 200 MΩ, 19.98 MΩ, 1.98 MΩ, 180 KΩ, respectively) form a range-changing network between the output and the inverting input of the amplifier 26. For best performance, the switches 32, 34, 36, 38, 40, 42 should have essentially no leakage when off and no voltage drop when on.

One side of the range-changing network is also connected to the output terminal 56 and the other side of the range-changing network is connected to the non-inverting input of the operational amplifier 58. The output terminal 56 is connectable to the test terminal of the DUT.

The inverting input of the amplifier 58 is connected to the output of the amplifier 58 and to one side of the resistor 60 (e.g., 20 KΩ). The other side of the resistor 60 is connected to the inverting input of the amplifier 24 and to one side of the resistor 62 (e.g., 20 KΩ). The other side of the resistor 62 is connected to the output of the amplifier 24 and the resistor 22.

An unshown power supply provides plus and minus $V_H$ (e.g., ±220 volts) to a power supply for the amplifiers 24, 28, 58. The current sources 64, 66 in combination with the zener diodes 68, 70 control the transistors 72, 74 to provide the plus and minus voltages $V_{F1}$ (e.g., ±5 volts) with respect to $V_F$. The output of the amplifier 28 follows $V_F$ and thus provides a voltage suitable for use in guarding and a $V_F$ reference for $V_{F1}$ through the resistor 76 and a capacitor 78 connected to the reference voltage $V_0$. $V_{F1}$ remains centered about $V_F$ as $V_F$ moves (e.g., ±200 volts).

$V_{F1}$ provides a return path for the difference between SMU current and DUT current through $V_0$ (in this embodiment $V_R$ and $V_0$ are the same), otherwise the preamplifier 12 would have no current gain.

In operation, the preamplifier 12 is connected between the SMU 10 and the DUT 14 and the appropriate range-changing switch 32, 34, 36, 38, 40, 42 is selected for the desired current range. The voltage $V_F$ is applied to the input terminal 16. The feedback from the output of the amplifier 26 through the range-changing network forces the output terminal 56 to $V_F$. In order to provide the corresponding current to the DUT, the output of the amplifier 26 must assume a corresponding value $V_T$.

The amplifiers 24, 58 and the resistors 22, 60, 62 form an inverting voltage to current converting circuit. They convert the voltage $V_T$ to a corresponding opposite polarity SMU current. The output of the amplifier 24 may be considered the voltage terminal and the terminal 16 considered the current terminal of the voltage to current converter circuit.

The amplifier 58 is configured as a follower, resulting in the output of the amplifier 58 being $V_T$ as well. The combination of the resistors 60, 62 and the amplifier 24 act as an inverter resulting in the output of the amplifier 24 being $-V_T$. The load resistor 22 has the difference between $V_F$ and $-V_T$ across it, resulting in current flow from the SMU. This current is proportional to the ratio of the load resistor 22 to the selected range-changing resistor 44, 46, 48, 50, 52, 54 times the current in the DUT. For example, 100 picoamperes, 1 nanoamperes, 10 nanoamperes, 100 nanoamperes, 1 microamperes, and 10 microamperes (full scale), respectively, will each produce a 100 microampere (full scale) current from the SMU.

While the above description describes the case of the SMU forcing a voltage and measuring a current, the preamplifier works the same way when the SMU is forcing a current and measuring a voltage. As expected, the forced current is scaled down by the preamplifier and the voltage from the DUT is passed through. This bi-directional nature of the preamplifier is ideally adapted for use with a SMU.

The preamplifier 12 can also be used in measuring or outputting charge. If all of the switches 32, 34, 36, 38, 40, 42 are open, the capacitor 80 (e.g., 1 picofarad) integrates, thus providing a $V_T$ corresponding to charge.

One or more of the power supplies for the preamplifier 12 may also be located in the SMU 10 or switching matrix 15. This allows the preamplifier 12 to be further miniaturized, which, in general, permits closer location to the DUT 14.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed:

1. A measurement system for performing measurements on a device under test, said system comprising: a source measure unit and a preamplifier, said preamplifier being connectable between said source measure unit and said device under test in a position closer to said device under test than to said source measure unit, wherein said preamplifier bi-directionally scales source measure unit current with respect to device under test current.

2. A measurement system according to claim 1, wherein a power supply for said preamplifier is located in said source measurement unit.

3. A measurement system for performing measurements on a device under test, said system comprising: at least one source measure unit, at least one switching matrix, and a plurality of preamplifiers, said source measure unit being connectable to said switching matrix and said preamplifiers being connectable between said switching matrix and said device under test, wherein said preamplifiers bi-directionally scale source measure unit current with respect to device under test current.

4. A measurement system according to claim 3, wherein a power supply for said preamplifiers is located in said switching matrix.

5. A measurement system according to claim 3, wherein at least one of said plurality of preamplifiers is located in a position closer to said device under test than to said switching matrix.

6. A current scaling bi-directional preamplifier having an input terminal and an output terminal, said preamplifier comprising:

an operational amplifier having an inverting input, a non-inverting input, and an output;

a range-changing network having a first and a second side; and an inverting voltage to current converting circuit having a current terminal and a voltage terminal, said input terminal communicating with said amplifier non-inverting input and said current terminal, said amplifier output communicating with said first side and said voltage terminal, said amplifier inverting input communicating with said second side and said output terminal, wherein a current into said input terminal and a current out of said output terminal are in a proportion selectable by said range-changing network.

7. A preamplifier according to claim 6, wherein said inverting voltage to current circuit comprises a follower amplifier having a follower input and a follower output, said follower input communicating with said voltage terminal; an inverter having an input and an output, said inverter input communicating with said follower output; and a load, said load communicating between said inverter output and said current terminal.

8. A preamplifier according to claim 7, wherein said follower amplifier and said inverter are powered by a power supply that provides a current path for the difference between said current into said input terminal and said current out of said output terminal.

9. A method for scaling a current from a device under test to a source measure unit, said device having a test terminal and said unit having a forced terminal, said method comprising:

providing an operational amplifier having an inverting input, a non-inverting input, and an output;

providing a range-changing network having a first and a second side; and providing an inverting voltage to current converting circuit having a current terminal and a voltage terminal, said forced terminal communicating with said amplifier non-inverting input and said current terminal, said amplifier output communicating with said first side and said voltage terminal, said amplifier inverting input communicating with said second side and said test terminal, wherein a current from said forced terminal and a current into said test terminal are in a proportion selectable by said range-changing network.

10. A method according to claim 9, wherein said voltage to current circuit comprises a follower amplifier having a follower input and a follower output, said follower input communicating with said voltage terminal; an inverter having an input and an output, said inverter input communicating with said follower output; and a load, said load communicating between said inverter output and said current terminal.

11. A preamplifier according to claim 10, wherein said follower amplifier and said inverter are powered by a power supply that provides a current path for the difference between said current from said forced terminal and said current into a test terminal.

12. A current scaling bi-directional preamplifier having an input terminal and an output terminal, said preamplifier comprising:

an operational amplifier having an inverting input, a non-inverting input, and an output;

an inverting range-changing network having a first and a second side; and a voltage to current converting circuit having a current terminal and a voltage terminal, said input terminal communicating with said amplifier inverting input and said current terminal, said amplifier output communicating with said first side and said voltage terminal, said amplifier non-inverting input communicating with said second side and said output terminal, wherein a current into said input terminal and a current out of said output terminal are in a proportion selectable by said range-changing network.

13. A method for scaling a current from a device under test to a source measure unit, said device having a test terminal and said unit having a forced terminal, said method comprising:

providing an operational amplifier having an inverting input, a non-inverting input, and an output;

providing an inverting range-changing network having a first and a second side; and providing a voltage to current converting circuit having a current terminal and a voltage terminal, said forced terminal communicating with said amplifier inverting input and said current terminal, said amplifier output communicating with said first side and said voltage terminal, said amplifier non-inverting input communicating with said second side and said test terminal, wherein a current from said forced terminal and a current into said test terminal are in a proportion selectable by said range-changing network.

* * * * *